United States Patent [19]

Nakata

[11] Patent Number: 5,119,761
[45] Date of Patent: Jun. 9, 1992

[54] SUBSTRATE HEATING APPARATUS FOR FORMING THIN FILMS ON SUBSTRATE SURFACE

[75] Inventor: Rempei Nakata, Tokyo, Japan
[73] Assignee: Kabushiki Kaisha Toshiba, Kawasaki, Japan
[21] Appl. No.: 632,082
[22] Filed: Dec. 21, 1990

[30] Foreign Application Priority Data

Jan. 19, 1990 [JP] Japan .................................. 2-8226

[51] Int. Cl.$^5$ .................... C23C 16/46; F27D 11/00
[52] U.S. Cl. .................... 118/725; 219/390; 118/724
[58] Field of Search ............ 219/390, 411, 385, 405; 118/620, 715, 716, 725, 724; 427/50, 49

[56] References Cited

U.S. PATENT DOCUMENTS 4,556,785 12/1985 Blechschmid et al. ............. 219/390
4,579,080 4/1986 Martin et al. ...................... 118/724
4,771,730 9/1988 Tezuka ............................... 118/724

Primary Examiner—Bruce A. Reynolds
Assistant Examiner—Tuan V. To
Attorney, Agent, or Firm—Oblon, Spivak, McClelland, Maier & Neustadt

[57] ABSTRACT

An improved substrate heating apparatus for use in a low-pressure CVD technique is provided. The apparatus comprises a substrate fixing member whose surface is coated with a heat reflector that reflects heat generated by a substrate heater. By virtue of this heat reflector, the surface temperature of the substrate fixing member can be maintained significantly lower than that of a substrate to be processed. Thus undesirable, thin film deposition on the surface of the substrate fixing member can be effectively suppressed. As a result, wasteful material gas consumption can be minimized, and the rate of forming thin films on the substrate surface can be held substantially constant.

19 Claims, 8 Drawing Sheets

SUBSTRATE HEATING APPARATUS FOR FORMING THIN FILMS ON SUBSTRATE SURFACE

BACKGROUND OF THE INVENTION

1. Field of the Invention

This invention relates to a substrate heating apparatus for forming thin films on a substrate surface, and more particularly to a substrate heating apparatus suitable for the use in a CVD (Chemical Vapor Deposition) technique.

2. Description of the Prior Art

Conventionally, in the process of manufacturing semiconductor devices, a CVD technique has been employed to form thin films of various kinds on a substrate. Specifically, material gas is supplied to the substrate so as to form thin films on the surface thereof by chemical reaction. In recent years, a low-pressure chemical vapor deposition (LPCVD) technique has been mainly employed, wherein thin films are formed on the substrate under a lower pressure in order to enhance the uniformity of film thickness and film quality. To accelerate such chemical reaction, and to form good quality thin films, the substrate is usually heated up to a desired temperature.

The substrate is usually heated by use of the following techniques. Specifically, the wafer is placed on the heater which is heated by resistance heating or high-frequency induction heating. Further, the substrate is directly heated by infrared ray-lamp heating.

FIG. 12 is a schematic cross-sectional view illustrating a conventional low-pressure CVD apparatus into which a resistance heater is incorporated. In FIG. 12, a container 101 is made of aluminum alloy, and the wall thereof is water-cooled by use of a water cooling pipe 102. The container 101 has a reaction chamber 103 in which thin films are formed on a substrate 107 by use of the low-pressure CVD technique. Material gases are introduced into the reaction chamber 103 through a material gas supply pipe 104. The pressure of the reaction chamber 103 is reduced by use of an exhaust system (not shown) through a vent 105 provided in the bottom of the reaction chamber 103. A quartz susceptor 106 is disposed at the bottom of the reaction chamber 103. A heater 108 which heats the substrate 107 is provided on the quartz susceptor 106. The quartz susceptor 106 serves as a thermal insulating member that prevents the heat of the heater 108 from radiating outside. The heater 108 comprises a tungsten wire 109 covered with an aluminum oxide 110. The tungsten wire 109 is connected through copper leads 111 to a power source (not shown). The tungsten wire 109 is energized to generate heat such that the substrate 107 is heated to hold a prescribed constant temperature. The quartz susceptor 106 and the heater 108 constitute a substrate table.

FIG. 11 is a graph illstrating the relationship between the pressure in the reaction chamber 103 and the respective surface temperatures of the heater 108 and the substrate 107. Specifically, I represents the surface temperature of the heater, and II represents the surface temperature of the substrate. FIG. 11 shows the change of the surface temperature II of the substrate with respect to the change of the pressure in the reaction chamber while the surface temperature I of the heater is being held constant.

As can be seen from FIG. 11, the difference between the surface temperatures I and II is held small under a pressure substantially the same as the atmospheric pressure. This is because heat generated by the heater is carried to the substrate both by radiation and by the convection of vapor between the heater and the substrate under such a pressure. However, there is substantially no convection of the vapor under a lower pressure. Thus, the heat generated by the heater is carried to the substrate only by radiation, resulting in a lower efficiency of heat conduction. Therefore, in order to raise the surface temperature of the substrate to a desired temperature, the temperature of the heater must be much higher than the desired surface temperature of the substrate.

When thin films are formed on the substrate 107 under the lower pressure, an undesirable thin film 112 is inevitably formed on the surface of the heater 108, as shown in FIG. 13. This is because the surface temperature of the heater 108 is higher than that of the substrate 107. If such thin film formations are repeatedly performed, the thickness of the undesirable thin film 112 increases and eventually peels off the heater 108 resulting in dust. Further, the material gas is consumed in the vicinity of the surface of the heater 108. Thus, the growth rate of the desirable thin films on the substrate 107 is decreased.

To solve the above-described disadvantages, the inventor of the present invention has disclosed an apparatus wherein the peripheral portion of a substrate is covered with a quartz cover member (see Japanese Patent Laid-open Publication No. 63-18079). However, this quartz cover member alone is not sufficient to suppress the undersirable heat conduction toward the peripheral portions of the substrate. Specifically, when this apparatus is used continuously for a long time, the undesirable thin films is deposited on the quartz cover member by consuming the material gas. Thus, further improvement thereof has been desired.

SUMMARY OF THE INVENTION

Accordingly, one object of this invention is to provide a substrate heating apparatus that can efficiently heat a substrate to be processed by minimizing undesirable heat conduction toward the peripheral fixtures of the substrate.

Briefly, in accordance with one aspect of the present invention, there is provided a substrate heating apparatus for containing a substrate therein and forming thin films thereon, which comprises a substrate container having a reaction gas introducing inlet and a vent therefor, a substrate mounting device provided in the substrate container for mounting the substrate, substrate heater for heating the substrate mounted on the substrate mounting device, and substrate fixing device for fixing the substrate to the substrate mounting device, and for reflecting heat generated by the substrate heater.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DESCRIPTION OF THE PREFERRED EMBODIMENTS

Figure 1A:
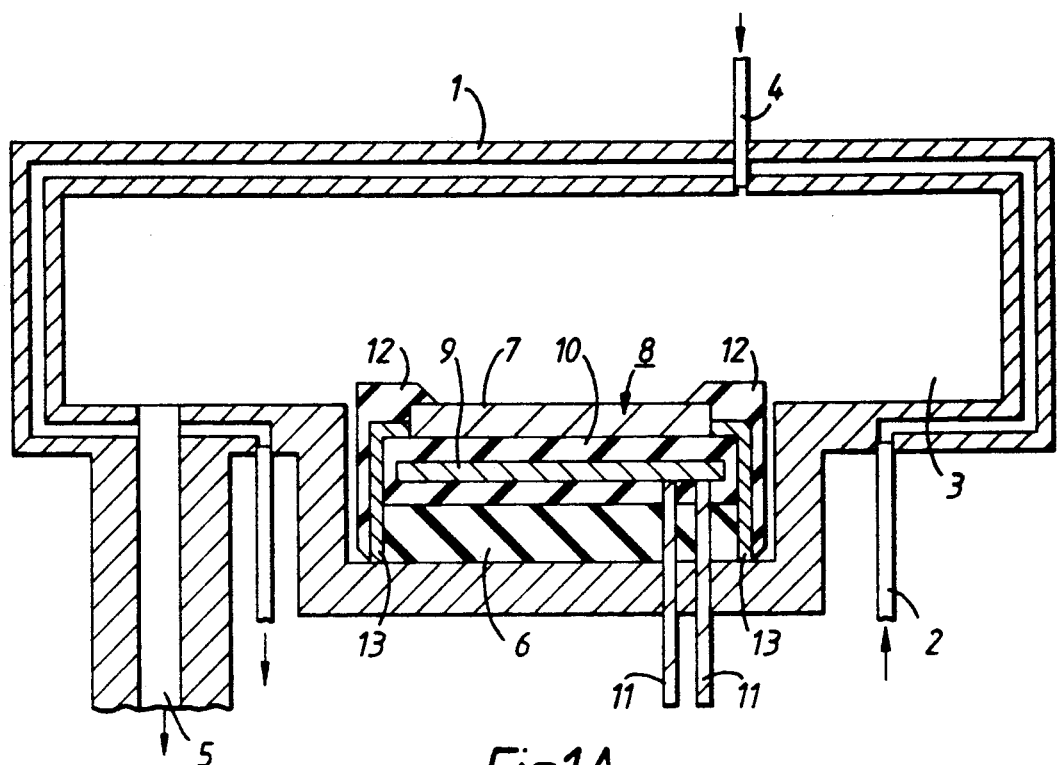
FIG. 1A is a cross-sectional view illustrating a first embodiment according to the present invention.

Referring now to the drawings, wherein like reference numerals designate identical or corresponding parts throughout the several view, and more particularly to FIG. 1A thereof, a first embodiment of this invention will be described.

Figure 1B:
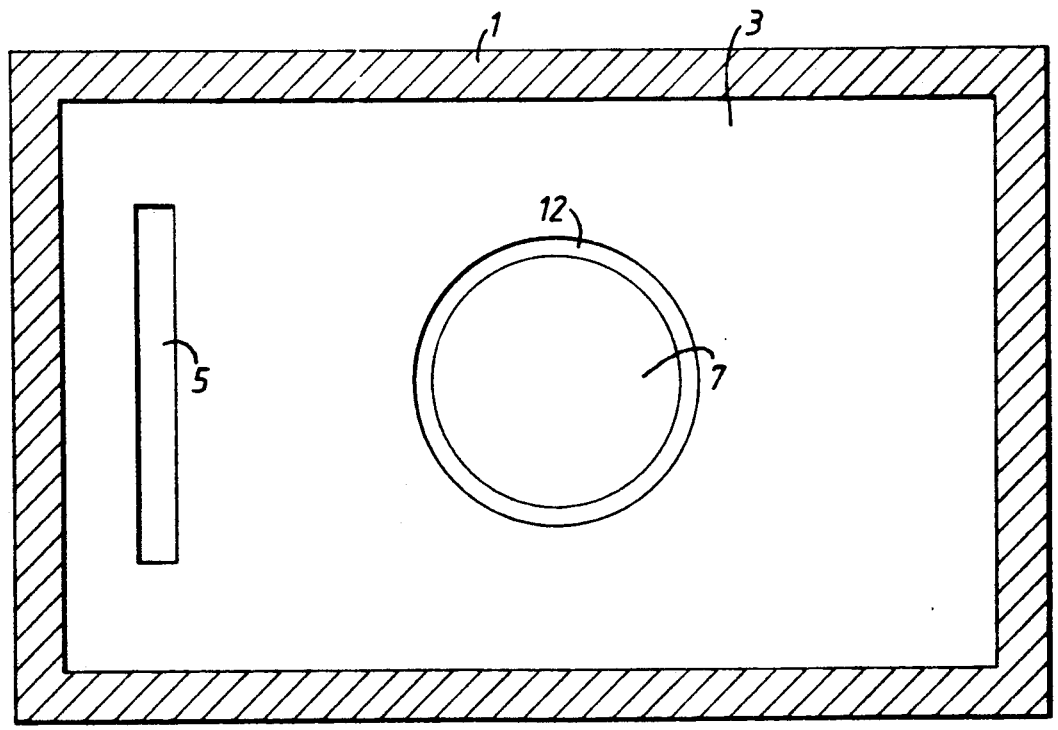
FIG. 1B is a top view illustrating the first embodiment shown in FIG. 1A.

FIG. 1A is a schematic cross-sectional view illustrating a low-pressure CVD apparatus according to a first embodiment of the present invention. FIG. 1B is a top view illustrating the apparatus shown in FIG. 1A. In FIG. 1A, a container 1 is made of aluminum alloy, and the wall thereof is water-cooled by use of a water cooling pipe 2. The container 1 has a reaction chamber 3 in which thin films are formed on a substrate 7 by use of the low-pressure CVD technique. Material gases are introduced into the reaction chamber 3 through a material gas supply pipe 4. The pressure of the reaction chamber 3 is reduced by use of an exhaust system (not shown) through a vent 5 provided in the bottom of the reaction chamber 3. A quartz susceptor 6 is disposed at the bottom of the reaction chamber 3. A heater 8 which heats the substrate 7 is provided on the quartz susceptor 6. The quartz susceptor 6 serves as a thermal insulating member that prevents the heat of the heater 8 from radiating outside. The heater 8 comprises a tungsten wire 9 covered with an aluminum oxide 10. The tungsten wire 9 is connected through copper leads 11 to a power source (not shown). The tungsten wire 9 is energized to generate heat such that the substrate 7 is heated to hold a prescribed constant temperature. The quartz susceptor 6 and the heater 8 constitute a substrate table. A substrate fixing member 12 made of quartz is provided to fix the substrate 7 to the substrate table. When the substrate 7 is fixed, the sidewalls of the quartz susceptor 6 and the heater 8 are covered with the substrate fixing member 12. An aluminum film 13 has been formed by sputtering on the inner surface of the substrate fixing member 12, the inner surface being close to the heater 8. The aluminum film 13 serves as a heat reflector that reflects the heat generated by the heater 8. The substrate fixing member 12 is operated to fix or release the substrate 7 by use of an elevating mechanism (not shown).

Figure 2:
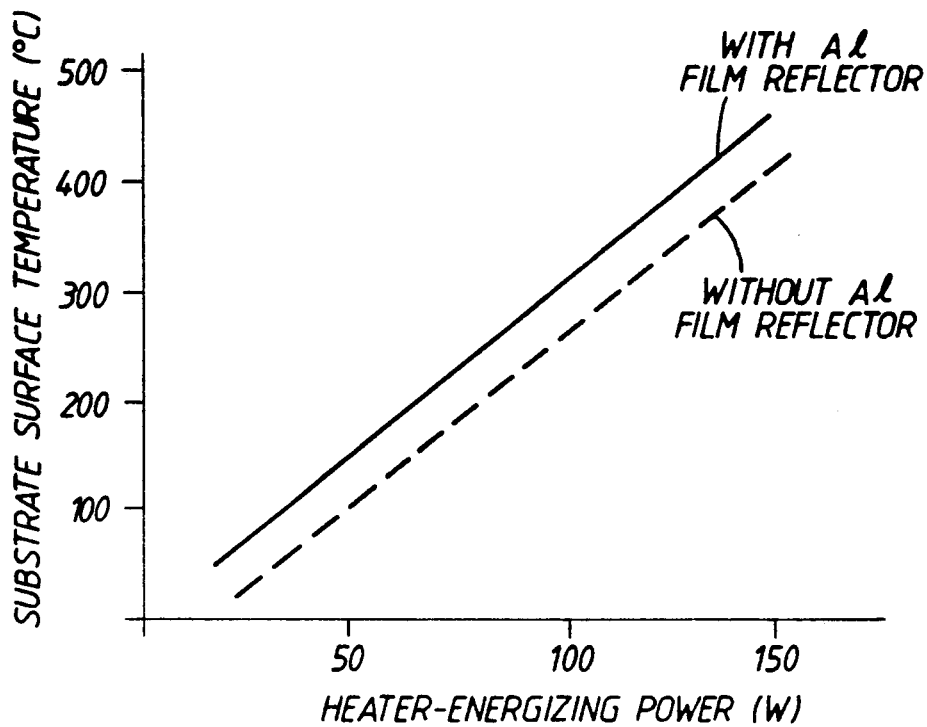
FIGS. 2 and 3 are characteristic diagrams for explaining the advantages of the first embodiment according to the present invention.

The advantages of the aluminum film 13 will be described with reference to FIG. 2. FIG. 2 shows the relationship between the heater-energizing power of the heater 8 and the surface temperature of the substrate 7. In FIG. 2, the solid line represents the case of the substrate fixing member 12 with the aluminum film 13, and the dotted line represents the case without the aluminum film 13. The relationship was obtained by measurements under the state in which the pressure in the reaction chamber 3 was maintained at $10^{-3}$ Torr. As can be seen from FIG. 2, the aluminum film 13 enhances the efficiency of heat conduction. This is because the aluminum film 13 reflects the infrared rays radiated from the heater 8, and supplies the infrared rays to the substrate efficiently.

Figure 3:
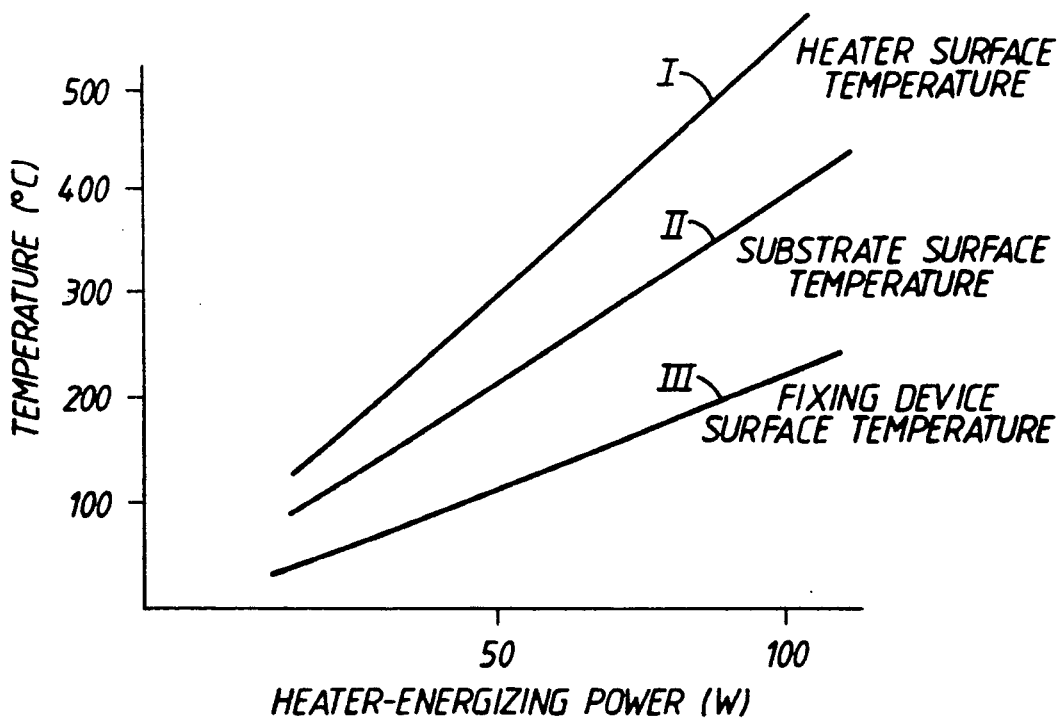

FIG. 3 shows the relationship between the heater-energizing power of the heater 8 and the surface temperatures of the substrate 7, the heater 8 and the substrate fixing member 12 with the aluminum film 13 attached thereto. In FIG. 3, the line I represents the surface temperature of the heater 8, the line II represents the surface temperature of the substrate 7, and the line III represents the surface temperature of the substrate fixing member 12 with the aluminum film 13 attached thereto. The relationship shown in FIG. 3 was obtained by measurements taken when the pressure in the reaction chamber 3 was maintained at $10^{-3}$ Torr. As can be seen from FIG. 3, the surface temperature of the substrate fixing member 12 was reduced to about half that of the heater 8 by virtue of the aluminum film 13.

Figure 4:
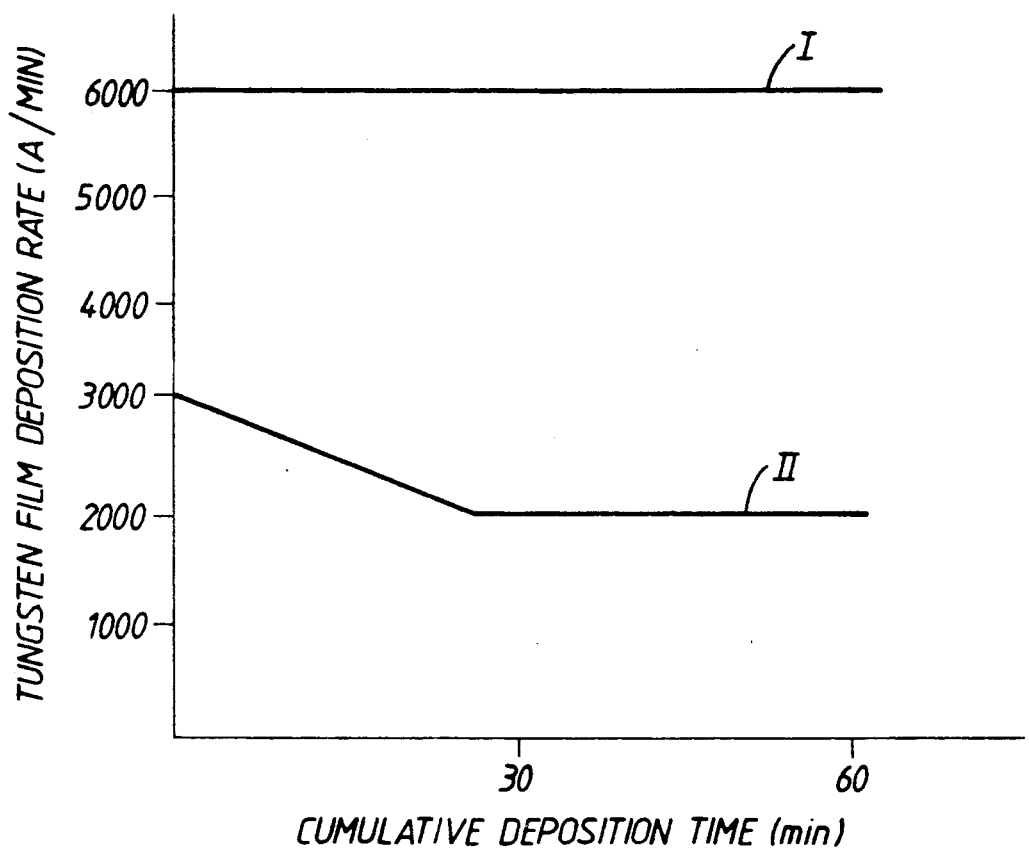
FIG. 4 is a graph illustrating the change of tungsten film deposition rates with respect to the cumulative deposition time when tungsten is deposited on the surface of a semiconductor substrate by use of the first embodiment according to the present invention.

The advantages of this embodiment will be described with reference to the following example, wherein the single-wafer processing low pressure CVD apparatus shown in FIG. 1 is used. The substrate 7 was heated by the heater 8 up to 260° C. Thereafter, tungsten hexafluoride of 10 sccm (standard cubic centimeter/minute) and silane of 10 sccm were introduced as material gases into the reaction chamber 3. The pressure in the reaction chamber 3 was reduced to 0.005 Torr. A tungsten film was then selectively deposited on the silicon substrate 7 at portions which were not covered with a silicon oxide film. In this case, the relationship between the cumulative deposition time and the tungsten film deposition rate was obtained as shown in FIG. 4. For the sake of comparison, two kinds of substrate fixing members 12, i.e., one with and one without the aluminum film 13, were used.

In FIG. 4, the line I represents the case with the aluminum film 13, and the line II represents the case without it. As seen from FIG. 4, the tungsten film deposition rate in the case with the aluminum film 13 (the line I) was held substantially constant at about 6000 Å/min. In contrast to this, the tungsten film deposition rate in the case without the aluminum film 13 (the line II) was about half that of the case with the aluminum film 13 at the begining. The rate of the line II decreased gradually to a rate substantially ⅓ that of the case of the line I (with the aluminum film 13), and was held thereat. This is because in the case of the line II, the surface temperature of the substrate fixing member 12 without the aluminum film 13 (i.e., having no heat reflector) increased significantly. Thus, an undesirable tungsten film was gradually deposited on the surface of the substrate fixing member 12. In other words, the material gases were consumed by depositing the undesirable tungsten film on the surface of the substrate fixing member 12. As a result, the deposition rate of the necessary tungsten film on the substrate was decreased gradually to a rate substantially ⅓ that of the case of the line I. After the surface of the substrate fixing member 12 was uniformly covered with tungsten, the deposition rate of the tungsten film on the substrate 7 was held substantially constant (at about 2000 Å/min), as shown in FIG.

4. In the case of the line I, i.e., with the aluminum film 13 according to the present invention, no wasteful tungsten film was formed on the surface of the substrate fixing member 12.

Figure 5:
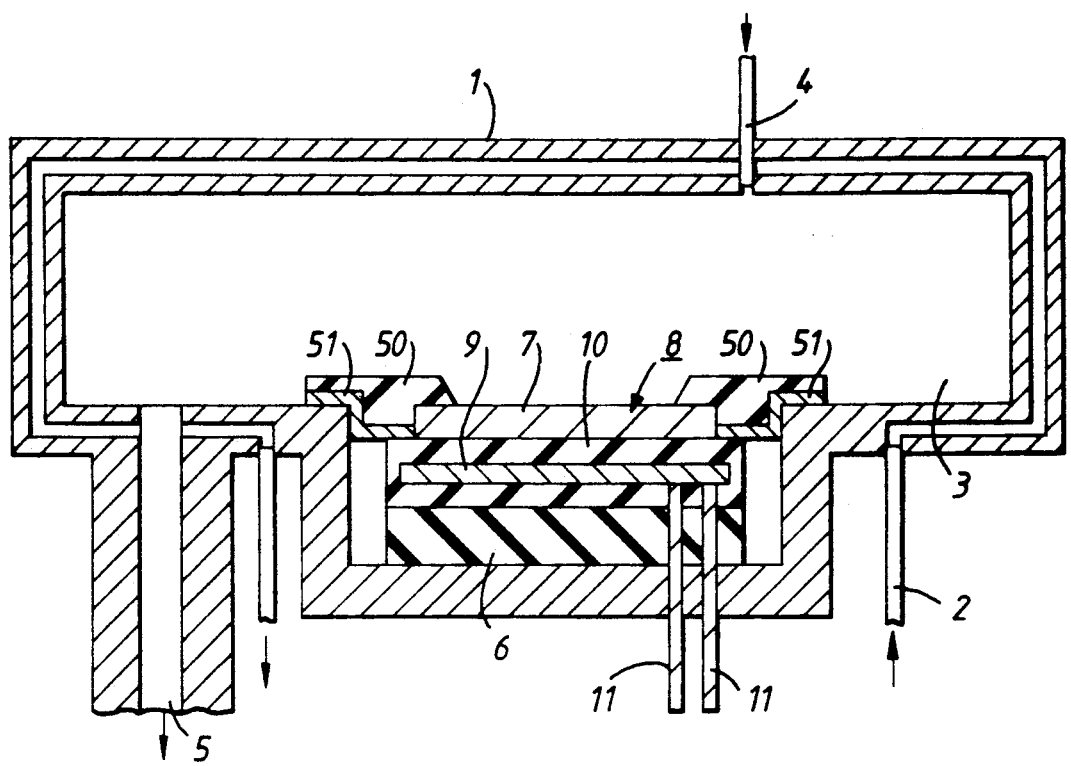
FIGS. 5 to 10 are cross-sectional views illustrating second through sixth embodiments according to the present invention.

Next, a second embodiment according to the present invention will be described with reference to FIG. 5. This embodiment differs from the first embodiment in that the shape of a substrate fixing member 50 is different from the shape of the substrate fixing member 12. Specifically, the substrate fixing member 50 extends to come in contact with a container 1 which is water-cooled. This contact is made through an aluminum film 51 formed on the surface of the member 50. The aluminum film 51 on the member 50 is also in contact with a heater 8, as shown in FIG. 5. This embodiment has the following advantages. Specifically, the aluminum film 51 reflects heat generated by the heater 8, and prevents heat from being carried to the substrate fixing member 50. Further, the aluminum film 51 on the member 50 is in contact with the water-cooled container 1. Thus, the surface temperature of the member 50 can be held significantly lower than that of a substrate 7. As a result, undesirable thin film formation on the member 50 can be more assuredly suppressed.

Figure 6:
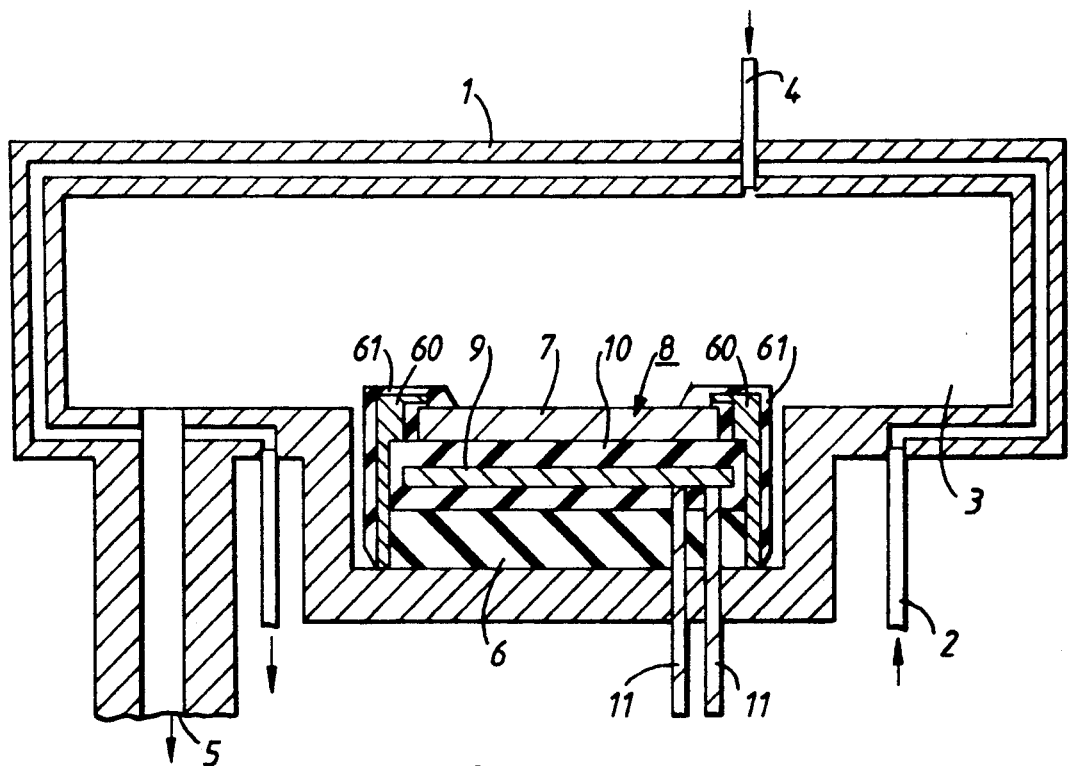

Next, a third embodiment according to the present invention will be described with reference to FIG. 6. This embodiment differs from the first embodiment in that the substrate fixing member 60 per se is made of aluminum. An aluminum oxide film 61 of several hundred Å thick is formed on the surface of the substrate fixing member 60, as shown in FIG. 6. The aluminum oxide film 61 protects the aluminum surface of the member 60 from being exposed to the atmosphere in a reaction chamber 3. This is because the aluminum oxide film 61 resists thin film deposition in a chemical reaction process such as a tungsten selective CVD technique, for example. The aluminum fixing member 60 may also be in contact with a container 1, as in the second embodiment shown in FIG. 5.

Figure 7:
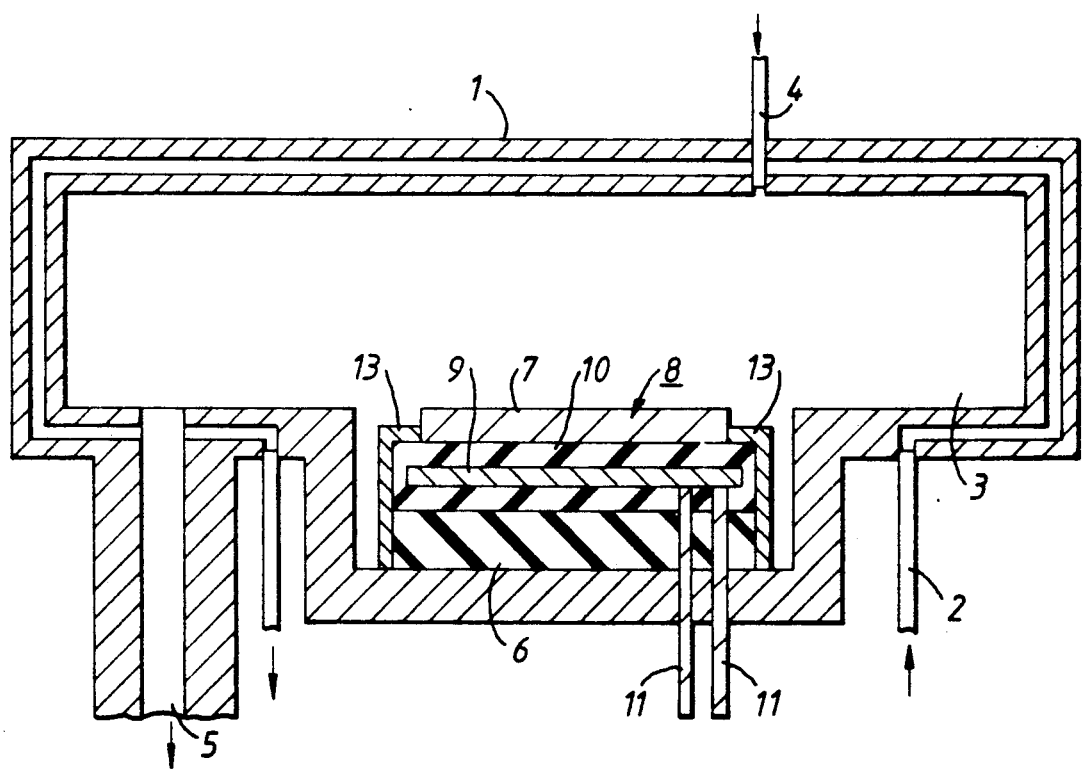

In the first, second and third embodiments, an aluminum film may also be provided between the quartz susceptor 6 and the heater 8 as a heat reflector. Further, in FIG. 7, an aluminum film 13 may also be provided on the sidewalls of both susceptor 6 and heater 8. This means that an aluminum heat reflector may be provided even in the case when a substrate fixing member is not prepared. In this case, substantially the same advantages as described above can be obtained.

Figure 8:
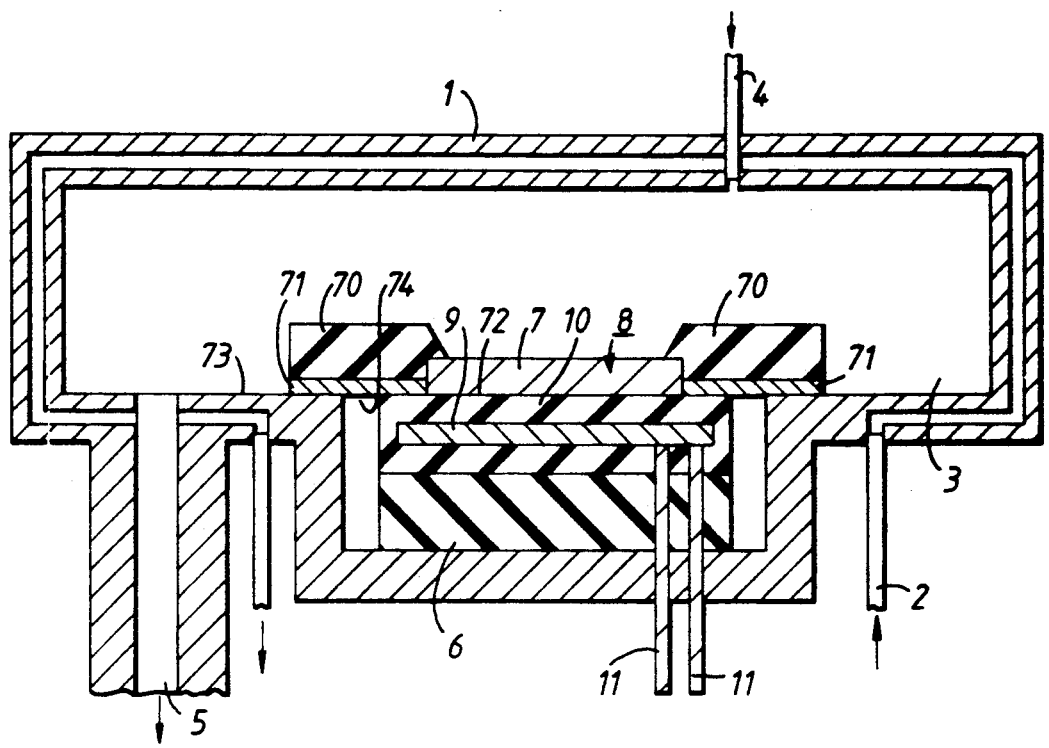

Next, a fourth embodiment according to the present invention will be described with reference to FIG. 8. This embodiment differs from the above-described embodiments in the following manner. Specifically, in FIG. 8, the surface 72 of a heater 8 and the inside face 73 of a reaction chamber 3 are in one plane. Thus, the face 74 of a substrate fixing member 70, which is in contact both with the surface 72 and the inside face 73 of the reaction chamber 3, can be made flat. To reflect heat generated by the heater 8, an aluminum film 71 is formed on the face 74 of the substrate fixing member 70. In this embodiment, the face 74 is flat and has no step portion. Thus, the substrate fixing member 70 can be formed in a simplified structure.

Next, a fifth embodiment according to the present invention will be described with reference to FIG. 9. This embodiment differs from the fourth embodiment shown in FIG. 8 in the following manner. Specifically, in FIG. 9, a substrate fixing member 80 is constituted by an upper member 80a and a lower member 80b. Further, an aluminum film 81 is formed on the lower surface of the lower member 80b. In the fourth embodiment shown in FIG. 8, the substrate fixing member 70 has an advantage in its simplified structure. However, it also has a disadvantage caused by its one-body structure for the following reason. Specifically, the faces of the substrate fixing member 70 must be in contact both with the substrate 7 and with the inside face 73 of the reaction chamber 3. Thus, the faces of the substrate fixing member 70 must be more accurately finished so that the reaction gas can be prevented from penetrating into portions other than the surface of the substrate 7.

Figure 9:
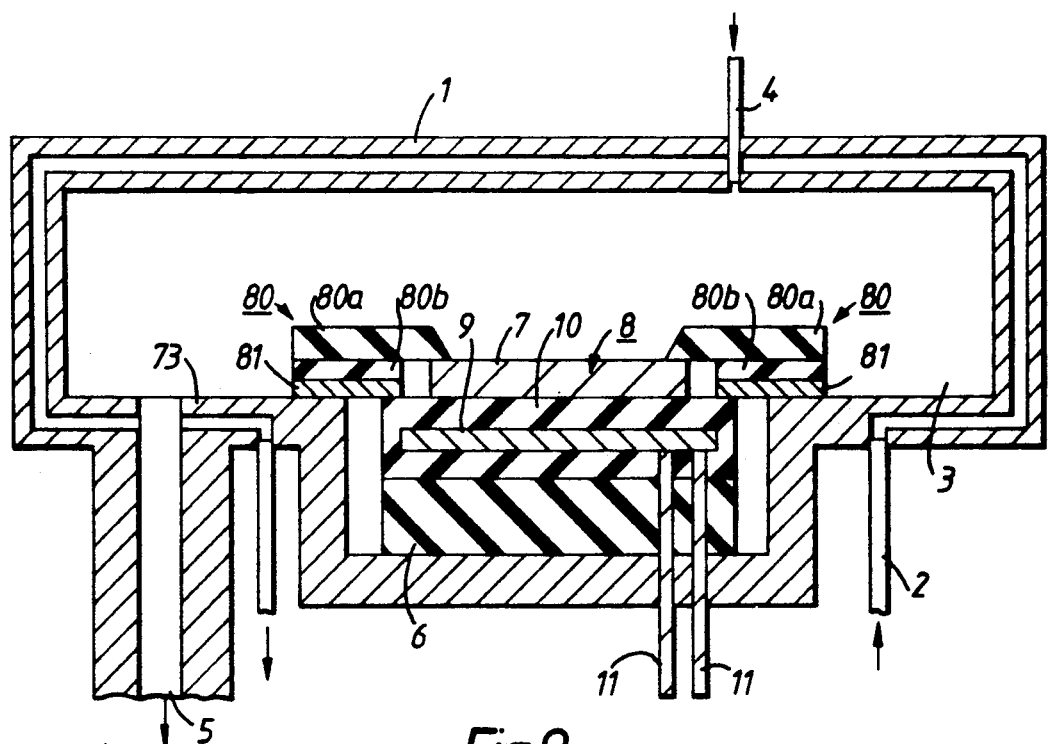

To eliminate this disadvantage, in the embodiment shown in FIG. 9, the substrate fixing member 80 is divided into two members, i.e., the upper member 80a and the lower member 80b. Specifically, the upper and lower members 80a and 80b respectively have only one face which must be accurately finished to achieve the reaction gas-sealing.

Figure 10:
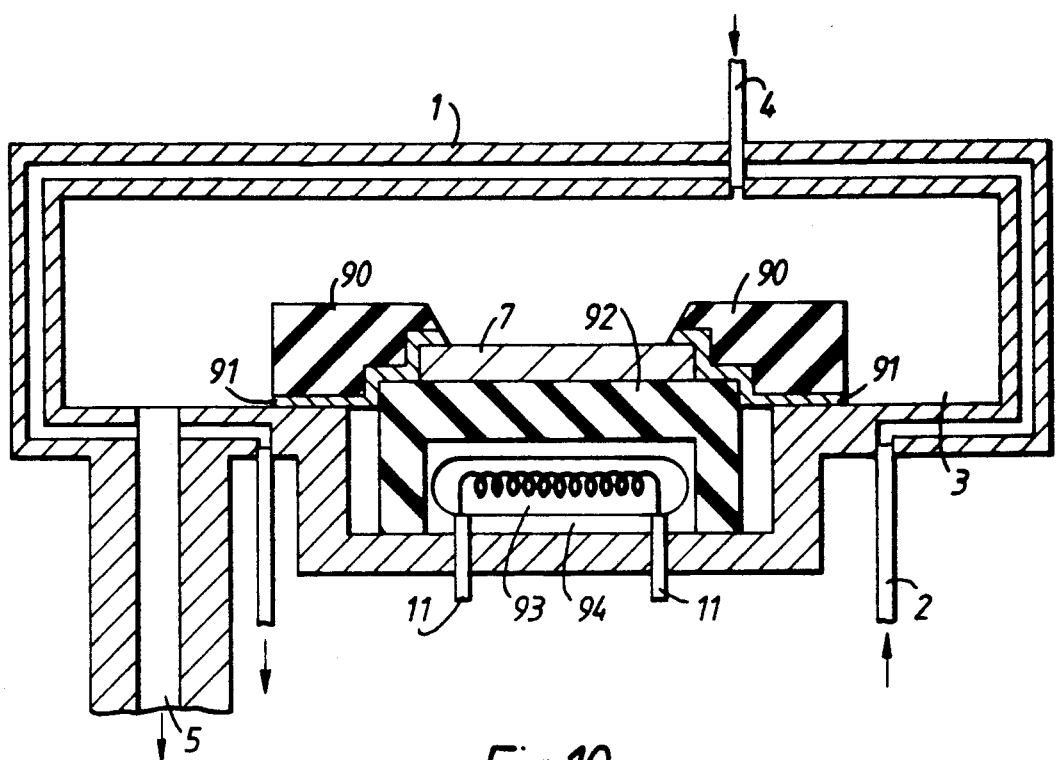
Figure 11:
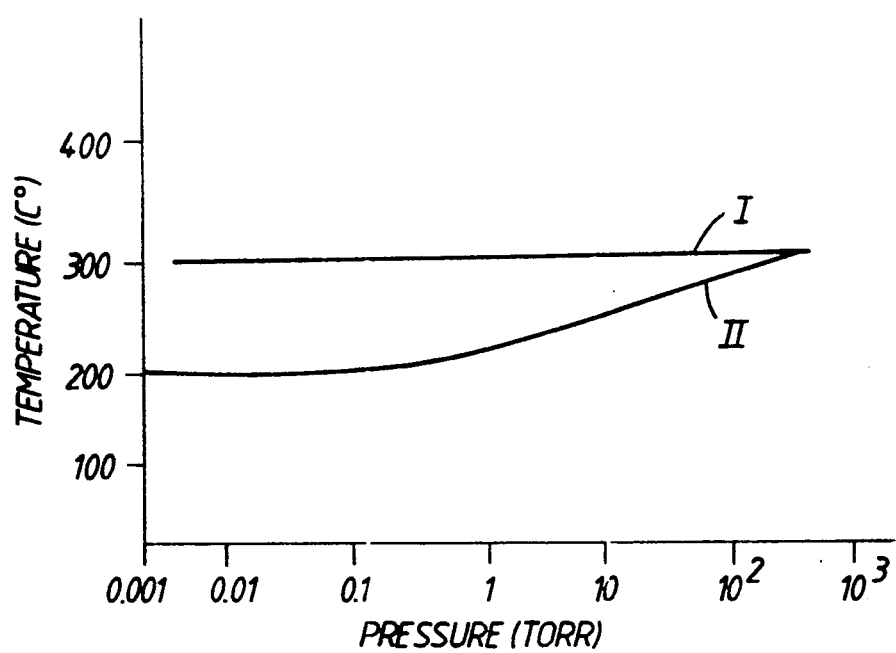
FIG. 11 is a graph illustrating the relationship between the surface temperatures of a heat generating member and the semiconductor substrate.
Figure 12:
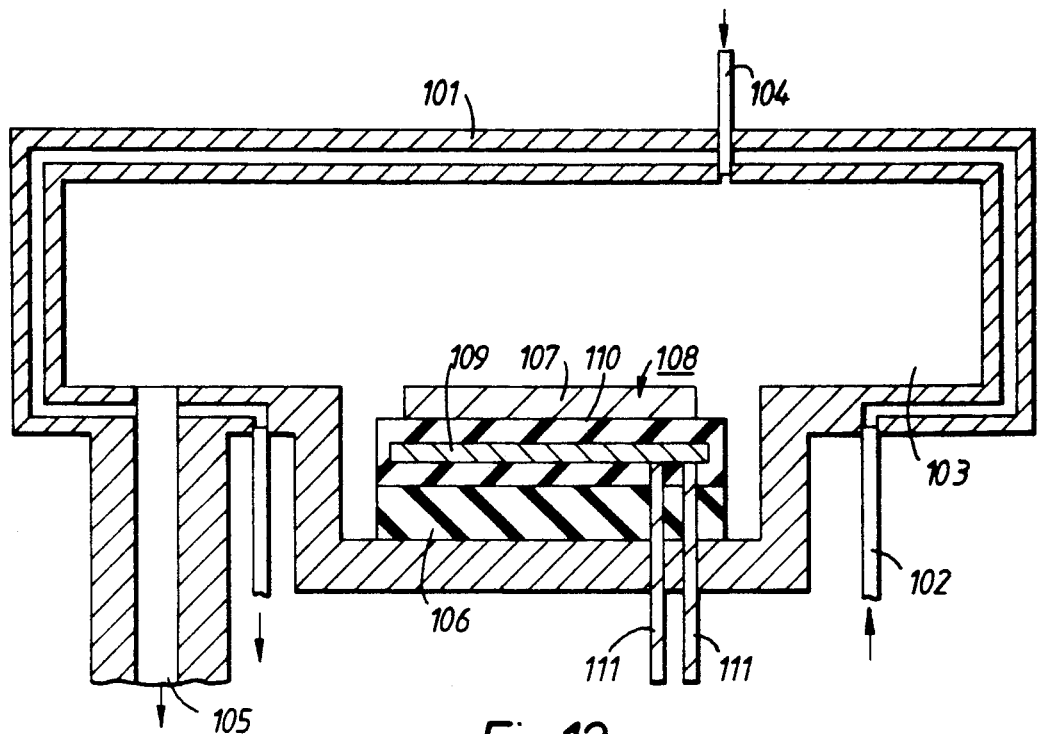
FIGS. 12 and 13 are cross-sectional view illustrating a conventional apparatus.
Figure 13:
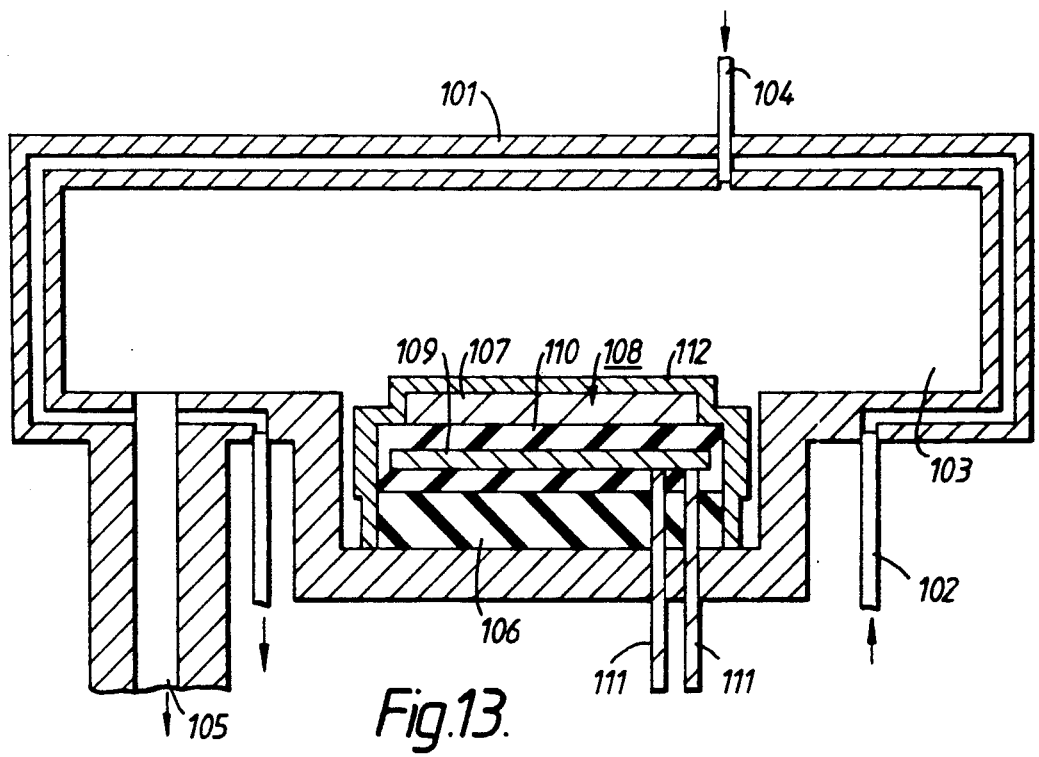

Next, a sixth embodiment according to the present invention will be described with reference to FIG. 10. In FIG. 10, the inside surface of a substrate fixing member 90 is in contact with a substrate 7, an alumina susceptor 92 and the inside surface of a reaction chamber 3. Further, an aluminum film 91 is formed on the inside surface of the substrate fixing member 90 to reflect infrared rays radiated from an infrared ray-lamp 93. The lamp 93 is disposed in the concave portion 94 of the alumina susceptor 92. The infrared rays from the lamp 93 heat the alumina susceptor 92 and further heat the substrate 7.

In the above-described embodiments, the reflectors are made of aluminum. However, other materials which reflect heat may also be employed. Such materials are nickle, nitride titanate, gold, silver, copper, platinum, zinc and the alloy thereof. In particular, nickel and nitride titanate having high melting points are advantageous to a CVD technique in which an SiC thin film is formed on a substrate at about $1000°$ C.

Further, the aluminum oxide film 61 in the third embodiment may be replaced with other oxides such as beryllium oxide, magnesium oxide, silicon oxide, thorium oxide and titanium oxide. In addition, the aluminum oxide film 61 may also be replaced with glass components.

Moreover, in the above description, resistance heating is used. However, any other heating techniques may also be employed. Similarly, the container 1 may be cooled by any known cooling techniques. In the above-described CVD technique, tungsten is selectively deposited on the silicon substrate surface. However, this is only an example, and this invention can be applied to various kinds of CVD techniques in which thin films are formed on a substrate being heated.

As described above, according to the present invention, the surface temperature of the substrate fixing member can be reduced to a temperature significantly lower than that of the substrate. Thus, undersirable thin film deposition on the surface of the substrate fixing member can be effectively suppressed. As a result, the wasteful material gas consumption can be avoided, and the rate of forming thin films on the substrate surface can be held constant.

Moreover, the substrate heating apparatus of this invention can prevent dust from being produced by the peel-off of undesirable films deposited on the substrate fixing member.

Obviously, numerous additional modifications and variations of the present invention are possible in light of the above teachings. It is therefore to be understood that within the scope of the appended claims, the invention may be practiced otherwise than as specifically described herein.

What is claimed is:

1. A substrate heating apparatus for forming thin films, comprising:
   substrate containing means for containing a substrate, said substrate containing means having a reaction gas introducing inlet and a vent therefor;
   substrate table means provided in said substrate containing means, for mounting said substrate;
   substrate heating means for heating said substrate mounted on said substrate table means; and
   substrate fixing means for fixing said substrate to said substrate table means, said substrate fixing means comprising heat reflecting means for reflecting heat generated by said substrate heating means.

2. The apparatus of claim 1, wherein said heat reflecting means includes a metal thin film provided on the surface of said substrate fixing means.

3. The apparatus of claim 1, wherein said substrate fixing means includes heat-reflecting material formed on the surface thereof at portions being in contact with said substrate heating means, and also includes a reaction gas-resist material coated on the surface thereof at portions being in contact with said reaction gas.

4. The apparatus of claim 1, wherein said substrate containing means includes cooling means for cooling said substrate containing means.

5. The apparatus of claim 4, wherein a portion of the heat reflecting means is in contact with said substrate containing means.

6. The apparatus of claim 4, wherein said cooling means includes water-cooling means attached to the inside periphery of said substrate containing means.

7. The apparatus of claim 1, wherein said substrate fixing means includes a ring-shaped member having an inside diameter smaller than the diameter of said substrate.

8. The apparatus of claim 2, wherein said metal thin film includes an aluminum thin film.

9. The apparatus of claim 1, wherein said heat reflecting means comprises a portion of said substrate fixing means which is made of heat reflecting material.

10. The apparatus of claim 9, wherein said substrate fixing means has a reaction gas-resist coating film formed on the surface thereof at portions being exposed to the inside of said substrate containing means.

11. The apparatus of claim 10, wherein said heat reflecting material includes aluminum.

12. The apparatus of claim 10, wherein said reaction gas-resist coating film includes aluminum oxide.

13. The apparatus of claim 9, wherein said heat reflecting material includes aluminum.

14. A substrate heating apparatus for forming thin films, comprising:
   substrate containing means for containing a substrate, having a reaction gas introducing inlet and a vent therefor;
   substrate table means provided in said substrate containing means, for mounting said substrate;
   substrate heating means for heating said substrate mounted on said substrate table means; and
   heat reflecting means provided on the surface of said substrate table means in the portions other than the portions for mounting said substrate thereon, for reflecting heat generated by said substrate heating means.

15. The apparatus of claim 14, wherein said heat reflecting means includes a metal thin film.

16. The apparatus of claim 15, wherein said metal thin film includes an aluminum thin film.

17. The apparatus of claim 14, wherein said substrate containing means includes cooling means for cooling said substrate containing means.

18. The apparatus of claim 17, wherein said cooling means includes water-cooling means attached to the inside periphery of said substrate containing means.

19. A substrate heating apparatus for forming thin films, comprising:
   substrate containing means for containing a substrate, said substrate containing means having a reaction gas introducing inlet and a vent therefor;
   substrate table means provided in said substrate containing means such that said substrate is mounted on said substrate table means;
   substrate heating means for heating said substrate mounted on said substrate table means;
   substrate fixing means for fixing said substrate to said substrate table means; and
   an aluminum film provided on an inner surface of said substrate fixing means such that said aluminum film is disposed between at least a surface of said substrate fixing means and a surface of said substrate heating means which face each other, wherein said aluminum film reflects heat generated by said substrate heating means.

* * * * *